United States Patent [19]
Smallwood, II

[11] Patent Number: 4,888,611
[45] Date of Patent: Dec. 19, 1989

[54] PHOTO-ELECTROMAGNETIC COLOR SEPARATION FOR REPRODUCTION OF COLOR IMAGES

[76] Inventor: Malvern C. Smallwood, II, 1703 Lewis O'Grey Dr., Saugus, Mass. 01906

[21] Appl. No.: 212,488

[22] Filed: Jun. 28, 1988

[51] Int. Cl.$^4$ .................. G03B 27/32; G03B 13/28
[52] U.S. Cl. .................................. 355/32; 355/77
[58] Field of Search ................ 355/32, 35, 38, 77

[56] References Cited

U.S. PATENT DOCUMENTS

| | | | |
|---|---|---|---|
| 3,044,202 | 7/1962 | Linomark | 355/32 X |
| 3,104,169 | 9/1963 | Metcalfe et al. | 204/181 P E X |
| 3,767,392 | 10/1973 | Ota | 204/181 P E X |
| 3,772,013 | 11/1973 | Wells | 204/181 P E X |
| 3,867,141 | 2/1975 | Bergfjord et al. | 252/501 X |
| 3,922,169 | 11/1975 | Bergfjord et al. | 252/62.1 X |
| 4,002,475 | 1/1977 | Ott et al. | 204/18 P C X |
| 4,264,193 | 4/1981 | Oonishi et al. | 355/32 |
| 4,293,216 | 10/1981 | Moore | 355/77 |

OTHER PUBLICATIONS

Dupont "Film Register".
Liquitex "Artists' Acrylic Modular Colors".
Dupont "Film contracting for the Graphic Arts".
Kodak "Color As Seen and Photographed".
Gassan "Handbook for Contemporary Photography".
Schnapf et al., "How Photoreceptor Cells Respond to Light", *Scientific American* (Apr. 1987), vol. 256, No. 4, pp. 40-47.
Dunn et al., "DDES, a Progress Report", *American Printer* (Aug. 1988), pp. 58-63.
Koon, "Quality High-Speed Imaging Systems", *American Printer* (Aug. 1988), p. 66.
"Imagesetting And Scanner Films Take A Quantum Leap", *American Printer* (Aug. 1988), p. 67.
Athridge, "Bringing the Darkroom Out of the Dark Ages", *Adv. Printing Impressions* (Oct. 1987), p. 53.
Advertisement, "Introducing Desktop Stripping", *Graphic Arts Monthly* (Sep. 1988).
"Affordable Electronic Color Imaging System in the Works", *American Printer* (Aug. 1988), p. 22.
*Operator's Manual*, Hell Chromagraph DC 300B, pp. 8, 24-25.

*Primary Examiner*—Donald A. Griffin
*Attorney, Agent, or Firm*—Fish & Richardson

[57] ABSTRACT

A method for converting a continuous tone image on a transparency, negative or the like into a halftone image includes the steps of providing a plurality of light-responsive elements upon a surface, each element adapted to generate a local electromagnetic field proportional to the relative intensity of light directed upon that element, a field of one element adapted to interact with fields of other, adjacent elements, directing light through the transparency upon the elements on the surface in a pattern of light and shadow to cause each element to generate a local field proportional to the magnitude of light directed upon that element, allowing the fields of the respective elements to interact to cause the elements to move upon the surface to achieve an equilibrium with the relative spacing of elements in at least one region being in proportion to the intensity of light directed upon that region, and recording the relative positions of the elements in that region for creating a halftone image of a corresponding region of continuous tone image. A system for converting a continuous tone image into a halftone image is also described.

23 Claims, 3 Drawing Sheets

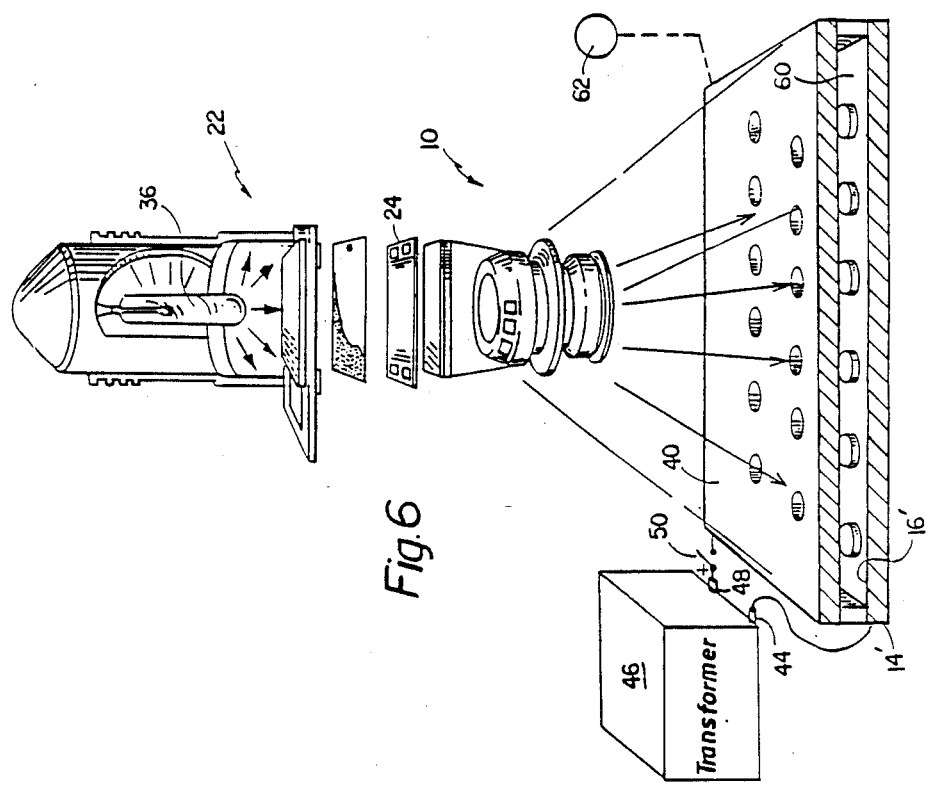
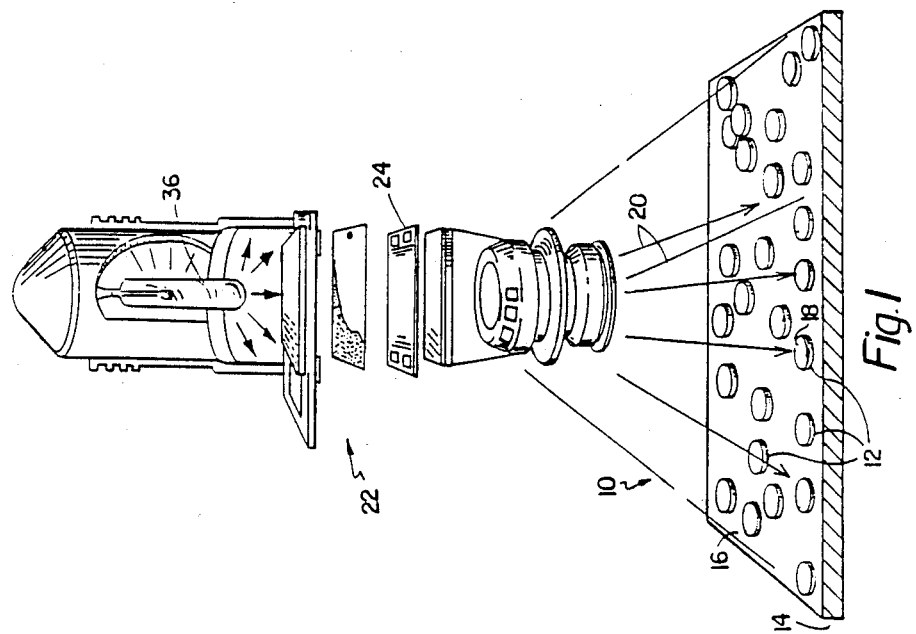

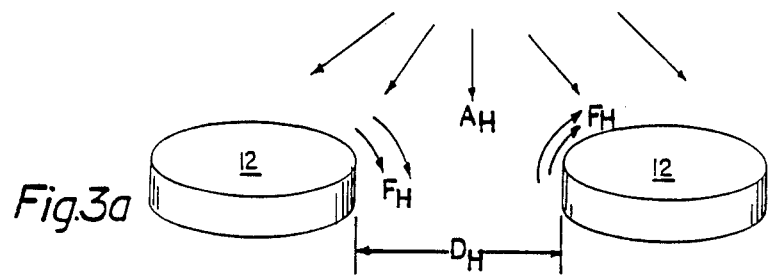
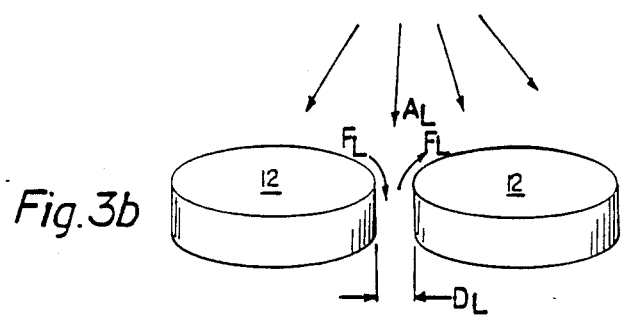
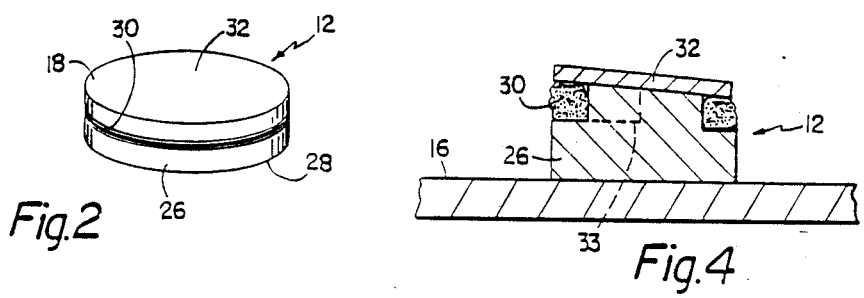
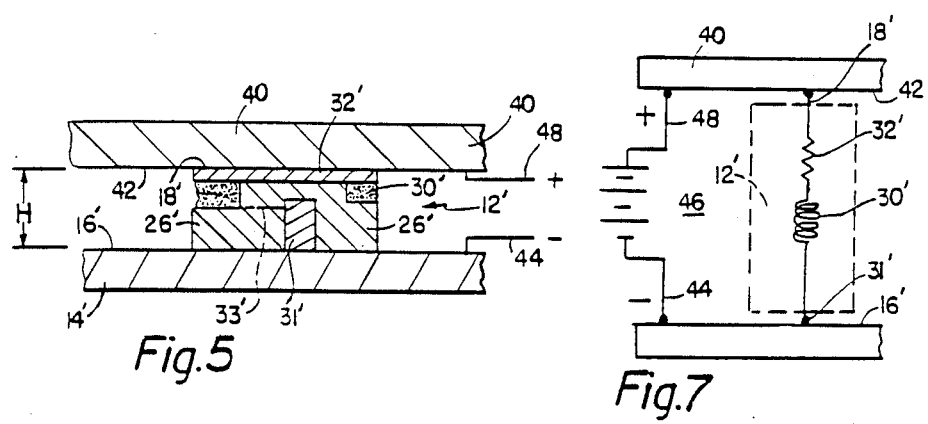

PHOTO-ELECTROMAGNETIC COLOR SEPARATION FOR REPRODUCTION OF COLOR IMAGES

This invention relates to a method and an apparatus for converting color or monochromatic continuous tone images, i.e., images formed by the transmission of light through, e.g., a slide or negative, or resolution of light from, e.g., a photograph, print or painting, or an electronically generated image, into halftone images, consisting of binary codable information, capable, e.g., of being copied directly through a lens or electronically recorded, stored and later recalled for the purpose of reproducing the image.

In conventional color image reproduction, there are used primary colors, additive or substractive. In this method of color reproduction or monochromatic tone scale reproduction, halftone images are generated, e.g. by transmission of a continuous tone image through a lens or by a laser beam, which must conform in some way to a lattice or screen pattern (a multiplicity of continous double convex lenses arranged at 90% to each other along an x, y axis) through which the image is passed. This conformity to the screen pattern generates a series of dots of diameter, circumference and dot structure which determines the relative percentage of color on any given area of the continuous tone original. A characteristic of this dot pattern is a checkerboard effect in the midtone area, caused by surface tension of the ink, which tends to pull the ink over the corners of the pattern to fill in adjacent negative or white square spaces. This phenomenon further intensifies the problem of tone scale compression and detail loss, which are unfortunate drawbacks of the existing methods. Another undesirable characteristic of these prior art methods of reproduction is a moire pattern, i.e., an undesirable interference with the geometric integrity of the original continous tone image, resulting in a sawtooth or staircase effect apparent to the viewer of the final print. The staircase or moire pattern is a factor of shapes in the original image which coincide with the inherent 90% graph pattern of the screens or electronic grids. There is a marked degree of tone scale compression on which manhours must be spent to try to recapture, by artificial photographic manipulation, the tone curve of the original image for the final reproduction. These effects are caused by the net effect of combining the tone curve and shape of the original continuous tone image with the mechanical shape of the grid.

Thus, in conventional color image reproduction, halftone images are created using fixed halftone screens at fixed grid angles to form halftone dots at arbitrary coordinates, wih the diameter, circumference and dot structure or shape determining the percentage of surface area covered, and the nature of the resulting print. The image to be converted is forced through a preexisting linescreen, and as a result, the halftone image suffers a marked degree of tone scale flattening or compression, similar in effect to passage through a light gray filter. To recapture the tone of the original print in the final print, many manhours must be spent to manipulate the colors of the halftone print to more closely approximate the color curves of the original image. The screen also blocks out some of the light, and in circumstances where lines of an image coincide with screen grid angles, an undesirable sawtooth or staircase pattern may result on the finished print.

SUMMARY OF THE INVENTION

According to one aspect of the invention, a method for converting a continuous tone image on a transparency negative or the like into a halftone image comprises providing a plurality of light-responsive elements upon a surface, each light-responsive element adapted to generate a local electromagnetic field proportional to the relative intensity of light directed upon that the element, a field of one element adapted to interact with fields of other, adjacent elements, directing light through a transparency, negative or the like upon the elements on the surface in a pattern of light and shadow to cause each element to generate a local field proportional to the magnitude of light directed upon that element, allowing the fields of the respective elements to interact to cause the elements to move upon the surface to achieve an equilibrium with the relative spacing of elements in at least one region being in proportion to the intensity of light directed upon that region, and recording the relative positions of the elements in the region upon the surface for creating a halftone image of a corresponding region of the continuous tone image.

In preferred embodiments, the field of a first element is adapted to repel fields of adjacent elements to cause the elements to move to achieve equilibrium position.

According to another aspect of the invention, a system for converting a continuous tone image on a transparency, negative or the like into a halftone image comprises a plurality of light-responsive elements, each element adapted to generate a local electromagnetic field proportional to relative intensity of light directed upon that element, the field of one element adapted to interact with fields of adjacent elements, a support surface upon which the elements are disposed to move to achieve an equilibrium of interacting fields in at least one region of the support surface, means for directing light through a negative, transparency or the like upon the elements disposed upon the surface in a manner to create a pattern of light and shadow upon the surface to cause each element to generate a local field proportional to the magnitude of light directed upon that element, and means for recording positions of the elements upon achievement of an equilibrium.

Preferred embodiments of this aspect of the invention may include one or more of the following features. The system further comprises electricity-conducting means associated with the support surface, a second electricity-conducting surface disposed above the elements, and a source of electrical power connected between surfaces, and the element comprises a body of nonconductive material, field generator means, a light-receiving surface portion of photo-diode material adapted to conduct electricity in proportion to the intensity of light impinged thereupon, means for connecting electrically in a circuit, the support surface, field generator, light-receiving surface portion and second surface, whereby the field generated about the element is proportional to the intensity of light impinged thereupon. The photo-diode material is selected from the group consisting of selenium and cadmium sulfide. The system further comprises a closed chamber defined in part by the support and second surfaces, and having the elements disposed therewithin, and means for increasing the pressure within the chamber in a manner to control bowing of the second surface. Preferably the system further comprises a second closed chamber beneath the support surface, and second means for increasing the pressure within the second closed chamber in a manner to control bowing of the support surface. The element further comprises a core of iron. The field generator means comprises a multiple winding of small diameter wire. The system further comprises electricity-conducting means associated with the surface, and the element comprises a body of nonconductive material, field generator means, a light-receiving surface portion of photovoltaic material adapted to generate electric potential in portion to the intensity of light impinged thereupon, means for connecting electrically in a circuit the field generator means and light-receiving surface portion, whereby the field generated about the element is proportional to the intensity of light impinged thereupon. The photovoltaic material is selected from the group consisting of cadmium sulfide and amorphous silicone. The element further comprises a core of iron. The field generator means comprises a multiple winding of small diameter wire.

According to another aspect of the invention, a method of forming images comprises the steps of providing a supporting surface, placing a plurality of photosensitive dot elements on the support surface, wherein each dot element produces an electromagnetic field proportional to the amount of radiation directed to each element for repelling adjacent elements; and exposing the plurality of elements to a pattern of radiation to which at least a portion of the elements produces an electromagnetic field at each element causing the plurality of elements to migrate until an image is formed.

Preferred embodiments of this aspect of the invention may include one or more of the following features. Each of the plurality of elements comprises an insulating body; a photosensitive element placed at one end of the body for detecting radiation, wherein the opposite end of the body is placed on the support surface; a wire disposed generally along an axis of the body and electrically connected to the photosensitive element; and a coil of wire wrapped around the body having one end electrically connected to the photosensitive element and the other end electrically connected to the wire disposed along the axis of the body; wherein, electrical current is caused to flow through the coil for producing the electromagnetic field when the photosensitive element detects radiation. The support surface is made of electrically conductive material. The method further comprises the step of connecting an electrical source to the conductive material for applying a potential across the conductive material. The photosensitive material is a photovoltaic cell. The method further comprises the step of exposing radiation equally to the plurality of photosensitive dot elements before exposing the elements to a pattern of radiation for evenly distributing the elements on the support surface. The support surface comprises a layer of conductive coated glass. The method further comprises the steps of placing a second, electricity-conducting surface over the plurality of photosensitive dot elements; and applying a potential between the surfaces. The photosensitive element is a photodiode.

According to still another aspect of the invention, a plurality of photosensitive dot elements for forming images on a support surface, wherein each element produces an electromagnetic field proportional to the amount of radiation directed to that element for repelling adjacent elements and causing the plurality of elements to migrate upon the surface until an equilibrium is achieved, each of the elements comprising an insulating body; a photosensitive element placed at one end of the body, wherein the opposite end of the body is placed on the support surface; a wire disposed generally within the body and electrically connected to the photosensitive element; and a coil of wire wrapped around the body having one end electrically connected to the photosensitive element and the other end of the coil of wire electrically connected to the wire.

Thus there is provided a method and an apparatus of photo-electromagnetic color separation ("PECS") for converting color or monochromatic continuous tone images into halftone images without the problems of quality and time experienced with conventional fixed line grid systems.

These and other features and advantages of the invention will be seen from the following description of a presently preferred embodiment, and from the claims.

PREFERRED EMBODIMENT

We first briefly describe the drawings.

FIG. 1 is a somewhat diagrammatic representation of the Photo-Electromagnetic Color Separation (PECS) apparatus of the invention in use with an illuminated continuous tone image projected through an enlarging head of standard design;

FIG. 2 is a perspective view of one preferred embodiment of a PECS disk of the invention;

FIGS. 3a and 3b are somewhat diagrammatic representations of a pair of the PECS disks of FIG. 2 at high light intensity and low light intensity, respectively;

FIG. 4 is a side section view of the PECS disk of FIG. 2;

FIG. 5 is a side section view of another preferred embodiment of the PECS disk of the invention;

FIG. 6 is a somewhat diagrammatic represenatation of a system including the PECS disk of FIG. 5;

FIG. 7 is a schematic of the circuit of the system of FIG. 6; and

Figure 8:
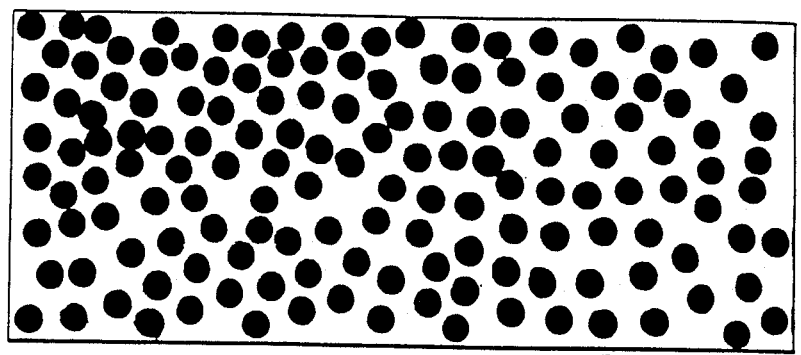
FIGS. 8, 8a and 8b are somewhat diagrammatic plan views of a segment of a PECS system of the invention before (FIG. 8) and after exposure to light through a positive image (FIG. 8a and a negative image (FIG. 8b) of a continuous tone image to be converted.

Referring to FIG. 1, one preferred embodiment of the PECS system 10 of the invention employs photovoltaic means for generation of electrical field, and consists of a multiplicity of horizontally mobile PECS disks 12 of uniform size and shape, i.e., a cylinder, disposed on a plate 14 having a low friction planar support surface 16. The PECS disks each have of an upper, light-receiving surface 18 positioned to receive light 20 from, e.g., an enlarger head 22, after it passes through the continuous image on transparency or negative 24 to be converted into a halftone image.

Referring now to FIG. 2, each PECS disk 12 consists generally of a body 26 having a bottom surface 28 constructed to move with little resistance upon the system support surface 16. Disposed about the body is a field generator 30, typically consisting of a multi winding of small diameter copper wire. A light-responsive material layer 32, having a light receiving surface 18 is disposed at the top of the disk, in electricity-conducting contact with the field generator. The magnitude of current delivered into the field generator, and the resultant magnitude of the field of repelling force generated about each PECS disk, is a function of the intensity of light passed through the image being converted and impinging upon the upper surface 18 of each PECS disk. As a result, in regions of highest light intensity ($A_H$, FIG. 3a) (i.e., for a positive image, areas of lighter color or light, and for a negative image, areas of darker color or shadow), each PECS disk generates a field ($F_H$) of relatively greater magnitude to keep adjacent PECS disks spaced apart at a relatively greater distance, $D_A$. Conversely, in regions of lowest light intensity ($A_L$, FIG. 3b) (i.e., for a positive image, areas of shadow or darker color, and for a negative image, areas of light or lighter color), the field ($F_L$) generated by each PECS disk is of relatively lesser magnitude, and the PECS disks space themselves apart at distance, $D_L$, i.e., relatively closer together. In the PECS system, the PECS disks 12 achieve an equilibrium upon surface 16, with the spacing of each disk proportional to the magnitude of light bearing upon that disk, which in turn is directly proportional to the amount of light passing through the corresponding region of the image being converted. This process is described in more detail below.

In one preferred embodiment (FIG. 4), the PECS disk 12 has a body 26 of dielectric material, e.g. any suitable polymeric material, and the field generator 30 consists of a thin copper wire wound in multiple layers about the upper portion of the body. The top layer 32 includes a photo voltaic material, e.g., cadminium sulfide or amorphous silicone, which generates electricity in proportion to the intensity of the light impinging upon top surface 18, and in turn powers the field generator 30 to produce a field (F) about the disk similarly in proportion to the intensity of light. The top layer 32 is electrically connected to winding 30 which in turn is connected (dashed line 33) to the photovoltaic material to complete the circuit.

In another preferred embodiment, shown in FIGS. 5, 6 and 7, PECS disk 12' (FIG. 5) includes a body 26' of dielectric material and a field generator 30' consisting of a multiple winding of small diameter copper wire. Disposed atop body 26' is a photo diode switch layer 32', of material, e.g., selenium or cadmium sulfide suspended in a vehicle of epoxy or other polymeric resin, having the chacteristic of conducting electricity in proportion to the intensity of light impinging upon the upper surface 18' of the disk 12'. Disposed with the body is a connector 31' formed of resilient, electricity-conducting material, e.g., beryllium copper, or it may be an iron core. Disk 12' is disposed between plate 14', formed of electricity-conducting material, e.g., metal, or of glass or other material having a coating of electricity-conducting material, and a transparent plate 40 of glass or the like with a transparent surface coating 42, e.g., NESA glass, or a coating of cuprous oxide or zinc oxide. Referring also to FIGS. 6 and 7, the conductive surface 16 of the lower plate 14 is connected to the cathode terminal 44 of a source of DC power, e.g., transformer 46, and the surface 42 of upper plate 40 is connected to the anode 48 of transformer 46. The resilient connector 31' bears in electrical contact upon surface 16' and urges the disk lightly upward for electrical contact of surface 18' of the disk with surface 42. The circuit is completed by contact of layer 32' with field generator 30', which in turn is connected to connector 31', indicated by dashed line 33'.

The operation of this PECS system of the invention is as described below, with each PECS disk 12' on surface 16' generating a field proportional to the intensity of light directed through the continuous tone image to be converted, and through the transparent top plate 40, onto that disk. In this embodiment, the disks may be set in the equilibrium position by deactuation of switch 50.

To convert a continuous tone image to a halftone image employing the Photo-Electromagnetic Color Separation method and apparatus of the invention, a multiplicity of PECS disks 12 are disposed at random upon surface 16 (FIG. 8). (This description will refer generally to use of the PECS disks 12 of the first preferred embodiment described above, but the PECS disks 12' of the second-described embodiment, or others, may simply be substituted.) A color or monochromatic continuous tone image to be converted into a halftone image, e.g., transparency or negative 24, is disposed between a projected light image source 36 and the PECS surface, in a manner whereby light from the source passes through the continous tone image 24 to impinge upon the surfaces 18 of PECS disks 12 disposed on surface 16.

Figure 8A:
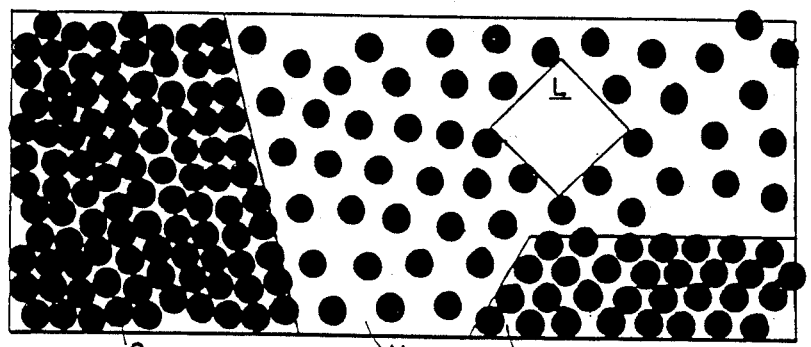

Referring now to FIG. 8a, there is shown a PECS system 10 of the invention having surface 16 upon which there is impinged a segment of an image having four regions, L, M, N, O, of contrasting light intensity, with region L having total light, region O having 100% shadow, and regions M and N having 25% and 50% shadow respectively.

Each PECS disk 12 generates a continuous field of repelling force, F, as described above, the magnitude of the force, F, being in proportion to the intensity of light impinging upon that disk (of course the force of the field about of a disk will fluctuate as it is moved, by the interacting fields of the system of disks, through areas of different light intensity). The disks 12, in response to the fields generated, move upon the surface 16 until an equilibrium is reached.

Once the equilibrium is achieved (FIG. 8a), the disks, now disbursed in an array corresponding to the intensity of light passing through the image, are photographed or electronically recorded.

Figure 8B:
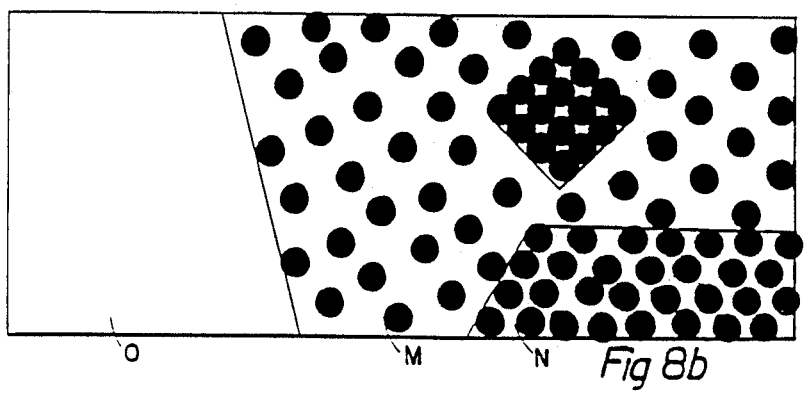

Typically, in order to maintain the area of coverage of the disks upon the surface at a maximum of about 50% to permit conversion of image areas of dark and shadow (a given set of circular disks of uniform diameter cannot, of course, occupy more than about 68% of a given area), two halftone images must be prepared. The first image is prepared from a positive image of the continuous tone image to be converted. In the region of full light (Region L, FIG. 8a), the PECS disks 12 are widely spaced with the full repelling force of the disks urging them apart. The disks 12 in the light/shadows regions (Regions M, N) are similarly dispersed, but are spaced more closely together, with the disks in Region N, the region of 50% shadow, being disposed more closely together than the disks of Region M (25% shadow). The PECS disks 12 in Region O (full shadow) generate little or no field, and the spacing is a function of a combination of their original spacing, movement of disks into the region across boundary P as the disks in the other regions move to obtain an equilibrium state, and also whatever little force individual disks in the region generate, e.g. at the boundary. The disks 12 on surface 16 are then photographed (or electronically recorded) to create a partial converted image. To obtain a full conversion of the continuous tone image, a negative image of the continuous tone image is prepared, with regions of light and shadow reversed. When light is impinged upon the system of PECS disks 12 on surface 16 through negative continuous tone image, the disks 12 rearrange themselves in a second equilibrium (FIG. 8b), with the disks in Region O spaced widely apart, and the disks in Region L packed more closely together. The disks in Region N (50% shadow) remain essentially as in FIG. 8a, while the disks in Region M (25% shadow in the original positive image, 75% dark in the negative image) become more closely packed as the fields generated by the respective disks in Region M are of lesser magnitude, and as disks move from Region O by the combined increased forces of the disks in that region urging disks toward regions of lower light intensity, i.e. Regions L, M and N When equilibrium is achieved, a photograph (or electronic recording) of this second partial converted image is taken, and then reversed from the negative image to a positive image.

The two partially converted images are then combined to create a final, converted halftone image of the original continuous tone image.

The combined photograph is then reduced and that image used to make a printing plate that reproduces, in halftone, the original continous tone image, with greater accuracy and quality than found possible with prior line grid converting procedures.

The PECS system may be employed for separation of variations in monochromatic values, i.e. dark to light gradation, and, through use of color separation filters, i.e., filters of the same colors as additive primary colors of light (Red, Blue, and Green), the PECS method of the invention may be used for separation of colors of the original by hue, value, and chromacity as well as monochromatic tone separation. For example, using a red filter, the color of the additive primary red color produces a dot array which represents the proportionate amounts of the substractive color of cyan in the original being reproduced. Using a green filter, the color of the additive color primary green will produce a dot array which corresponds to the subtractive primary color of magenta. A filter of the same color as the additive primary color of blue will produce a dot array which corresponds to the subtractive color yellow.

A modified filter may also be used to create a dot array corresponding to the dark shadow areas of the original, or an outline effect in the highlight and midtone areas of the original being reproduced for use as the Black Separation.

Other embodiments are within the following claims.

For example, in order to maintain uniform spacing, H, between surfaces 16', 42 of the alternate embodiment of the PECS system, a closed chamber 60 (FIG. 6) may be provided with means, e.g. a source of pressurized gas 62, for increasing the pressure within the chamber to reduce bowing of the upper plate. A second pressure chamber may be provided below the lower plate 14, 14' to maintain surface 16, 16' level. The conductive surface 16' may be reflective, e.g., silver-filled epoxy, or silver or carbon filled polymer. The surface 16, 16' may be liquid or a film, with the disks constructed to float or slide therealong.

There may also be provided means for detecting and recording the positions of the PECS disks upon the grid, for storing the pattern of disks digitally.

What is claimed is:

1. A method for converting a continuous tone image on a transparency negative or the like into a halftone image, comprising:

providing a plurality of light-responsive elements upon a surface, each said light-responsive element adapted to generate a local electromagnetic field proportional to the relative intensity of light directed upon that said element, a field of one said element adapted to interact with fields of other, adjacent said elements, directing light through a transparency, negative or the like upon said elements on said surface in a pattern of light and shadow to cause each said element to generate a local field proportional to the magnitude of light directed upon that said element, allowing the fields of the respective elements to interact to cause said elements to move upon said surface to achieve an equilibrium with the relative spacing of said elements in at least one region being in proportion to the intensity of light directed upon that said region, and recording the relative positions of said elements in said region upon said surface for creating a halftone image of a corresponding region of said continuous tone image.

2. The method of claim 1 wherein the field of a first said element is adapted to repel fields of adjacent said elements to cause said elements to move the achieve said equilibrium position.

3. A system for converting a continuous tone image on a transparency, negative or the like into a halftone image, comprising:

a plurality of light-responsive elements, each said element adapted to generate a local electromagnetic field proportional to relative intensity of light directed upon that said element, the field of one said element adapted to interact with fields of adjacent said elements, a support surface upon which said elements are disposed to move to achieve an equilibrium of interacting fields in at least one region of said support surface, means for directing light through a negative, transparency or the like upon said elements disposed upon said surface in a manner to create a pattern of light and shadow upon said surface to cause each said element to generate a local field proportional to the magnitude of light directed upon that said element, and means for recording positions of said elements upon achievement of an equilibrium.

4. The system of claim 3 further comprising electricity-conducting means associated with said support surface, a second electricity-conducting surface disposed above said elements, and a source of electrical power connected between said surfaces, and said element comprises:

a body of nonconductive material, field generator means, a light-receiving surface portion of photo-diode material adapted to conduct electricity in proportion to the intensity of light impinged thereupon, means for connecting electrically in a circuit, said support surface, said field generator, said light-receiving surface portion and said second surface, whereby the field generated about said element is proportional to the intensity of light impinged thereupon.

5. The system of claim 4 wherein said photo-diode material is selected from the group consisting of selenium and cadmium sulfide.

6. The system of claim 4 further comprising a closed chamber defined in part by said support surface and said second surface, and having said elements disposed therewithin, and means for increasing the pressure within said chamber in a manner to control bowing of said second surface.

7. The system of claim 6 further comprising a second closed chamber beneath said support surface, and second means for increasing the pressure within said second closed chamber in a manner to control bowing of said support surface.

8. The system of claim 4 wherein said element further comprises a core of iron.

9. The system of claim 4 wherein said field generator means comprises a multiple winding of small diameter wire.

10. The system of claim 3 further comprising
electricity-conducting means associated with said surface, and
said element comprises:
a body of nonconductive material,
field generator means,
a light-receiving surface portion of photovoltaic material adapted to generate electric potential in portion to the intensity of light impinged thereupon,
means for connecting electrically in a circuit said field generator means and said light-receiving surface portion,
whereby the field generated about said element is proportional to the intensity of light impinged thereupon.

11. The system of claim 10 wherein said photovoltaic material is selected from the group consisting of cadmium sulfide and amorphous silicone.

12. The system of claim 10 wherein said element further comprises a core of iron.

13. The system of claim 10 wherein said field generator means comprises a multiple winding of small diameter wire.

14. A method of forming images comprising the steps of:
providing a supporting surface;
placing a plurality of photosensitive dot elements on said support surface, wherein each of said dot element produces an electromagnetic field proportional to the amount of radiation directed to each of said element for repelling adjacent said elements; and
exposing said plurality of elements to a pattern of radiation to which at least a portion of said elements produces an electromagnetic field at each element causing said plurality of elements to migrate until an image is formed.

15. The method of claim 14 wherein each of said plurality of elements comprises:
an insulating body;
a photosensitive element placed at one end of said body for detecting radiation, wherein the opposite end of said body is placed on said support surface;
a wire disposed generally along an axis of said body and electrically connected to said photosensitive element; and
a coil of wire wrapped around the cylindrical surface of said body having one end electrically connected to said photosensitive element and the other end of said coil of wire electrically connected to said wire disposed along the axis of said body;
wherein, electrical current is caused to flow through said coil of wire for producing said electromagnetic field when said photosensitive element detects radiation.

16. The method of claim 14 wherein said support surface is made of electrically conductive material.

17. The method of claim 16 further comprising the step of connecting an electrical source to said conductive material for applying a potential across said conductive material.

18. The method of claim 14 wherein said photosensitive material is a photovoltaic cell.

19. The method of claim 14 further comprising the step of exposing radiation equally to said plurality of photosensitive dot elements before exposing said elements to a pattern of radiation for evenly distributing said plurality of elements on said support surface.

20. The method of claim 14 wherein said support surface comprises a layer of conductive coated glass.

21. The method of claim 14 further comprising the steps of:
placing a second, electricity-conducting surface over said plurality of photosensitive dot elements; and
applying a potential between said surface.

22. The method of claim 14 wherein said photosensitive element is a photodiode.

23. A plurality of photosensitive dot elements for forming images on a support surface, wherein each said dot element produces an electromagnetic field proportional to the amount of radiation directed to each of said elements for repelling adjacent said elements and causing said plurality of elements to migrate upon said surface until an equilibrium is achieved, each of said elements comprising:
an insulating body;
a photosensitive element placed at one end of said body, wherein the opposite end of said body is placed on said support surface;
a wire disposed generally within said body and electrically connected to said photosensitive element; and
a coil of wire wrapped around said body having one end electrically connected to said photosensitive element and the other end of said coil of wire electrically connected to said wire.

* * * * *

UNITED STATES PATENT AND TRADEMARK OFFICE
CERTIFICATE OF CORRECTION

PATENT NO. : 4,888,611
DATED : December 19, 1989
INVENTOR(S) : Malvern C. Smallwood, II It is certified that error appears in the above-identified patent and that said Letters Patent is hereby corrected as shown below:

Column 4, line 42, after "(FIG. 8a" insert --)--.

Column 4, line 59, after "multi" and before "winding" insert a hyphen.

Column 4, line 61, after "light" and before "receiving" insert a hyphen.

Column 5, line 53, after "16" insert --'--.

Column 5, line 54, after "14" insert --'--.

Column 7, line 11, after "N" insert a period.

Signed and Sealed this

Second Day of July, 1991

Attest:

HARRY F. MANBECK, JR.

*Attesting Officer*  *Commissioner of Patents and Trademarks*